US008446002B2

(12) United States Patent
Shibuta et al.

(10) Patent No.: US 8,446,002 B2
(45) Date of Patent: May 21, 2013

(54) MULTILAYER WIRING SUBSTRATE HAVING A CASTELLATION STRUCTURE

(75) Inventors: Noriko Shibuta, Aichi (JP); Tohru Terasaki, Aichi (JP); Tomoyasu Yamada, Aichi (JP); Nobuo Naito, Aichi (JP); Yukihiko Tsukuda, Aichi (JP); Ryu Nonoyama, Aichi (JP)

(73) Assignee: Sony Corporation, Tokyo (JP)

( * ) Notice: Subject to any disclaimer, the term of this patent is extended or adjusted under 35 U.S.C. 154(b) by 345 days.

(21) Appl. No.: 12/659,258

(22) Filed: Mar. 2, 2010

(65) Prior Publication Data

US 2010/0244166 A1 Sep. 30, 2010

(30) Foreign Application Priority Data

Mar. 30, 2009 (JP) ................................. 2009-083658

(51) Int. Cl.
| | | |
|---|---|---|
| H01L 23/053 | (2006.01) | |
| H01L 23/12 | (2006.01) | |
| H01L 27/15 | (2006.01) | |
| H01L 29/267 | (2006.01) | |
| H01L 31/12 | (2006.01) | |
| H01L 33/00 | (2010.01) | |
| H01L 29/73 | (2006.01) | |
| H01L 29/74 | (2006.01) | |
| H01L 31/111 | (2006.01) | |
| H01L 31/00 | (2006.01) | |
| H01L 29/40 | (2006.01) | |

(52) U.S. Cl.
USPC ............. 257/700; 257/81; 257/182; 257/433; 257/466; 257/621; 257/E21.597; 257/E23.011

(58) Field of Classification Search
USPC ................... 257/81, 182, 433, 466, 621, 700, 257/E21.597, E23.011
See application file for complete search history.

(56) References Cited

U.S. PATENT DOCUMENTS

| 5,637,916 A | * | 6/1997 | Joshi ............................. 257/668 |
| 6,617,946 B2 | * | 9/2003 | Kennedy et al. ............... 333/246 |
| 6,664,864 B2 | * | 12/2003 | Jiles et al. ..................... 331/176 |
| 6,734,541 B2 | * | 5/2004 | Shimoe et al. ................ 257/686 |

(Continued)

FOREIGN PATENT DOCUMENTS

| JP | 57-115850 A | 7/1982 |
| JP | 60-098648 A | 9/1985 |

(Continued)

OTHER PUBLICATIONS

Japanese Office Action issued Aug. 7, 2012 for corresponding Japanese Application No. 2009-083658.

(Continued)

*Primary Examiner* — Ida M Soward
(74) *Attorney, Agent, or Firm* — Rader Fishman & Grauer, PLLC

(57) ABSTRACT

A multilayer wiring substrate has a through hole that passes from a first surface through to a second surface. The multilayer wiring substrate includes an electrical connection terminal formed in at least one of an inner edge portion which is a periphery of the through hole, an outer edge portion which is an outer periphery of the substrate, and a non-edge portion, on at least one of the first surface and the second surface. The electrical connection terminal has a castellation structure that does not pass through to a surface opposite to a formation surface.

4 Claims, 11 Drawing Sheets

U.S. PATENT DOCUMENTS

| | | | | |
|---|---|---|---|---|
| 6,818,977 | B2* | 11/2004 | Poo et al. | 257/685 |
| 7,073,253 | B2* | 7/2006 | Adams et al. | 29/830 |
| 7,132,737 | B2* | 11/2006 | Miyazaki | 257/678 |
| 7,226,809 | B2* | 6/2007 | Poo et al. | 438/109 |
| 7,417,221 | B2* | 8/2008 | Creswick et al. | 250/239 |
| 7,473,577 | B2* | 1/2009 | Chainer | 438/106 |
| 7,563,640 | B2* | 7/2009 | Wakisaka et al. | 438/106 |
| 7,613,007 | B2* | 11/2009 | Amey et al. | 361/763 |
| 7,712,349 | B2* | 5/2010 | Katsuda et al. | 73/31.05 |
| 7,808,788 | B2* | 10/2010 | Gertiser et al. | 361/709 |
| 7,940,531 | B2* | 5/2011 | Watanabe | 361/760 |
| 2002/0000895 | A1* | 1/2002 | Takahashi et al. | 333/133 |
| 2002/0064029 | A1* | 5/2002 | Pohjonen | 361/719 |
| 2004/0000710 | A1* | 1/2004 | Oya | 257/700 |
| 2006/0145331 | A1* | 7/2006 | Cho et al. | 257/700 |
| 2006/0220227 | A1* | 10/2006 | Marro | 257/723 |
| 2006/0244124 | A1* | 11/2006 | Ohlsson | 257/700 |
| 2006/0279367 | A1* | 12/2006 | Knecht et al. | 331/107 A |
| 2007/0085194 | A1* | 4/2007 | Mao et al. | 257/700 |
| 2007/0126112 | A1* | 6/2007 | Cho et al. | 257/700 |
| 2007/0284727 | A1* | 12/2007 | Liao et al. | 257/700 |
| 2009/0201654 | A1* | 8/2009 | Simonovich et al. | 361/762 |
| 2012/0110842 | A1* | 5/2012 | Mazzochette | 29/837 |

FOREIGN PATENT DOCUMENTS

| | | | |
|---|---|---|---|
| JP | 11040948 A | * | 2/1999 |
| JP | 2002-353427 | | 12/2002 |
| JP | 2006-060178 A | | 3/2006 |
| JP | 200630335 A | * | 11/2006 |
| JP | 2007095927 A | * | 4/2007 |
| JP | 2007-194516 A | | 8/2007 |

OTHER PUBLICATIONS

Japanese Office Action issued Oct. 23, 2012 for corresponding Japanese Application No. 2009-083658.

* cited by examiner

FIG. 10

| ELECTRODE PATTERN | BACK SURFACE ELECTRODES ONLY (REFERENCE PATTERN) [FIG. 9] 11G | BACK SURFACE + OUTER PERIPHERAL SIDE SURFACE [FIG. 6] 11D | BACK SURFACE + INNER AND OUTER PERIPHERAL SIDE SURFACES [FIG. 3] 11A |
|---|---|---|---|
| NUMBER OF ELECTRODES | — (40) | 1.4 TIMES (56) | 1.4 TIMES (56) |
| SOLDER CONNECTION STRENGTH AGAINST THERMAL SHOCK *1 | 1 | 1.71 TIMES | 1.64 TIMES |

*1: CONNECTION STRENGTH IS INDICATED AS RATIO OF ACTUALLY MEASURED VALUE OF TEST PIECE TO THAT OF REFERENCE PATTERN, WHICH IS SET TO 1.

MULTILAYER WIRING SUBSTRATE HAVING A CASTELLATION STRUCTURE

BACKGROUND OF THE INVENTION

1. Field of the Invention

The present invention relates to a multilayer wiring substrate, a stack structure sensor package, and a method of manufacturing the stack structure sensor package that are applied to an image sensor and the like.

2. Description of the Related Art

Japanese Unexamined Patent Application Publication No. 2002-353427 proposes a stack structure sensor package of an image sensor.

FIG. 1 illustrates the stack structure sensor package of the image sensor as disclosed in Japanese Unexamined Patent Application Publication No. 2002-353427.

In a sensor package structure in FIG. 1, a frame-shaped second substrate 2 is joined onto a first surface of a first substrate 1, thereby forming a cavity 3.

An integrated circuit 4 is mounted on the first surface of the first substrate 1 in the cavity 3, and an image sensor chip 5 is joined onto the second substrate 2. Thus, the stack structure sensor package is formed.

SUMMARY OF THE INVENTION

However, the above-mentioned structure is limited to a stack-up manufacturing process in which the integrated circuit 4 is joined after the cavity 3 is formed by the first substrate 1 and the second substrate 2. This has the following disadvantages.

Since the stack-up in the same process step is necessary, a manufacturing location is limited.

Besides, occurrence of a failure causes a high disposal cost. In detail, when a failure occurs during manufacture, for example, during image sensor sealing, all components of the stack structure sensor package are disposed of due to the failure.

When the above-mentioned stack structure sensor package is joined to another structure by a junction terminal on a back surface of the first substrate 1, the stack structure sensor package is typically soldered to an organic substrate. However, there may be a problem with connection strength because a joint area is limited to the bottom surface.

Furthermore, since the sensor and the integrated circuit 4 for processing sensor signals are packaged, a component for realizing an additional function is additionally placed outside the package. This contradicts miniaturization.

It is desirable to provide a multilayer wiring substrate, a stack structure sensor package, and a method of manufacturing the stack structure sensor package that enable a sensor component to be reused even when a failure occurs during manufacture, improve connection strength of the sensor component, and make the structure small and thin.

A multilayer wiring substrate according to an embodiment of the present invention has a through hole that passes from a first surface through to a second surface, and includes an electrical connection terminal formed in at least one of an inner edge portion which is a periphery of the through hole, an outer edge portion which is an outer periphery of the substrate, and a non-edge portion, on at least one of the first surface and the second surface. The electrical connection terminal has a castellation structure that does not pass through to a surface opposite to a formation surface.

A stack structure sensor package according to another embodiment of the present invention includes: a multilayer wiring substrate, having a through hole, that includes a wire bonding pad on a first surface and an electrical connection terminal on a second surface, the electrical connection terminal being formed in at least one of an inner edge portion which is a periphery of the through hole, an outer edge portion which is an outer periphery of the substrate, and a non-edge portion; an image sensor that is fixed to the periphery of the through hole on the first surface of the multilayer wiring substrate so as to lay across the through hole of the multilayer wiring substrate, and is electrically connected to the pad by a wire; a frame that is fixed to the outer edge portion on the first surface of the multilayer wiring substrate so as to surround the image sensor; and an optical filter that is fixed to a surface of the frame so as to face the image sensor.

A method of manufacturing a stack structure sensor package according to still another embodiment of the present invention includes the steps of: fixing an image sensor to a periphery of a through hole on a first surface of a multilayer wiring substrate so as to lay across the through hole of the multilayer wiring substrate, the multilayer wiring substrate having the through hole and including a wire bonding pad on the first surface and an electrical connection terminal on a second surface, the electrical connection terminal being formed in at least one of an inner edge portion which is the periphery of the through hole, an outer edge portion which is an outer periphery of the substrate, and a non-edge portion; electrically connecting the pad of the multilayer wiring substrate and the image sensor by a wire; fixing a frame to the outer edge portion on the first surface of the multilayer wiring substrate so as to surround the image sensor; and fixing an optical filter to a surface of the frame so as to face the image sensor.

According to the embodiments of the present invention, it is possible to reuse a sensor component even when a failure occurs during manufacture of a sensor package having a stack structure, to improve connection strength of the sensor component, and to make the structure small and thin.

BRIEF DESCRIPTION OF THE DRAWINGS

FIG. 10 shows the number of electrodes and a result of measured solder strength against thermal shock in each of the multilayer wiring substrates in FIGS. 6 and 3, relative to the multilayer wiring substrate in FIG. 9;

DESCRIPTION OF THE PREFERRED EMBODIMENTS

The following describes embodiments of the present invention with reference to the drawings in the following order.
1. Embodiment
2. Another embodiment
<1. Embodiment>

Figure 1:
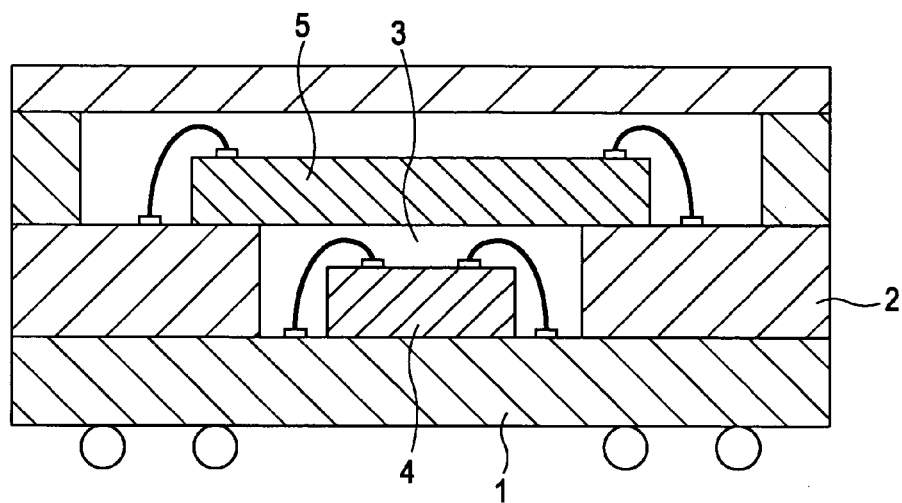
FIG. 1 illustrates a stack structure sensor package of an image sensor as disclosed in Japanese Unexamined Patent Application Publication No. 2002-353427.
Figure 2:
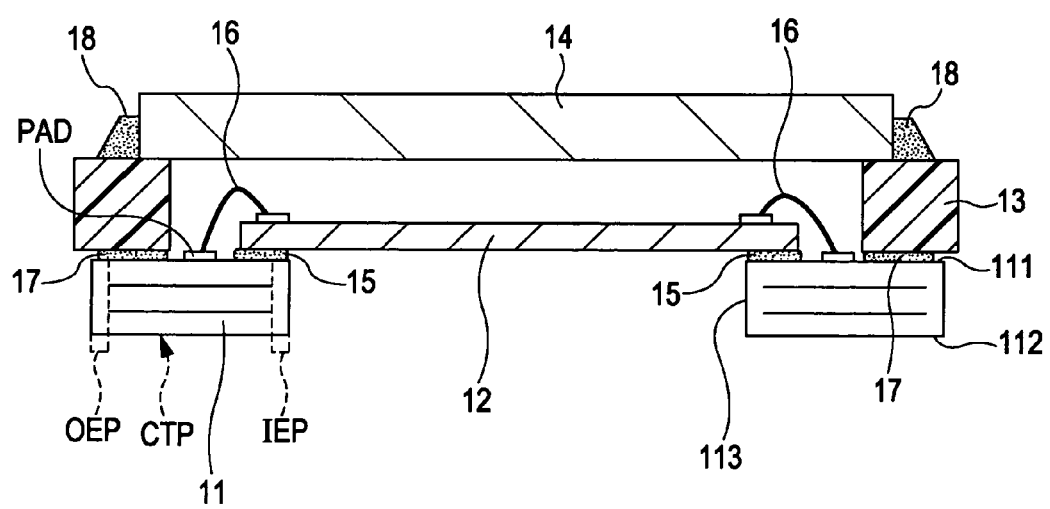
FIG. 2 illustrates a structure example of a stack structure sensor package to which a multilayer wiring substrate is applied according to an embodiment of the present invention.

FIG. 2 illustrates a structure example of a stack structure sensor package to which a multilayer wiring substrate is applied according to an embodiment of the present invention.

A sensor package 10 has a stack structure that basically includes a multilayer wiring substrate 11, an image sensor chip 12, a frame 13 formed of ceramic, a resin, or the like, and an optical filter 14 as main components.

The multilayer wiring substrate 11 is a substrate that serves as a base of the stack structure sensor package 10 of an image sensor, and has the following characteristic structure.

A through hole 113 that passes from a first surface (front surface) 111 through to a second surface (back surface) 112 is formed in a center portion of the multilayer wiring substrate 11.

In the multilayer wiring substrate 11, an electrical connection terminal (electrode) is formed in at least one of an inner edge portion IEP which is a periphery of the through hole 113, an outer edge portion OEP which is an outer periphery of the substrate itself, and a non-edge portion, on at least one of the first surface 111 and the second surface 112.

In the multilayer wiring substrate 11, the electrical connection terminal (electrode) formed in at least one of the inner edge portion IEP and the outer edge portion OEP has a castellation (depression) structure that does not pass through to (does not reach) a surface opposite to a formation surface, as described later.

The electrical connection terminal (electrode) formed in at least one of the inner edge portion IEP and the outer edge portion OEP is intended for an improvement in connection strength with another substrate and the like.

Moreover, the castellation structure of the electrical connection terminal (electrode) formed in at least one of the inner edge portion IEP and the outer edge portion OEP has a function of improving the connection strength and also alleviating a stress that acts upon the electrode from the outside and the like.

In the multilayer wiring substrate 11 illustrated in FIG. 2, a wire bonding pad PAD is formed at a center between the inner edge portion IEP and the outer edge portion OEP on the first surface 111, and the electrical connection terminal (electrode) is formed in at least one of the inner edge portion IEP and the outer edge portion OEP on the second surface 112.

In addition, a connection terminal (internal electrode) is formed in a center portion CTP between the inner edge portion IEP and the outer edge portion OEP on the second surface 112 of the multilayer wiring substrate 11.

The following describes more specific structure examples of the multilayer wiring substrate 11, with reference to drawings.

FIRST STRUCTURE EXAMPLE OF THE MULTILAYER WIRING SUBSTRATE

Figure 3:
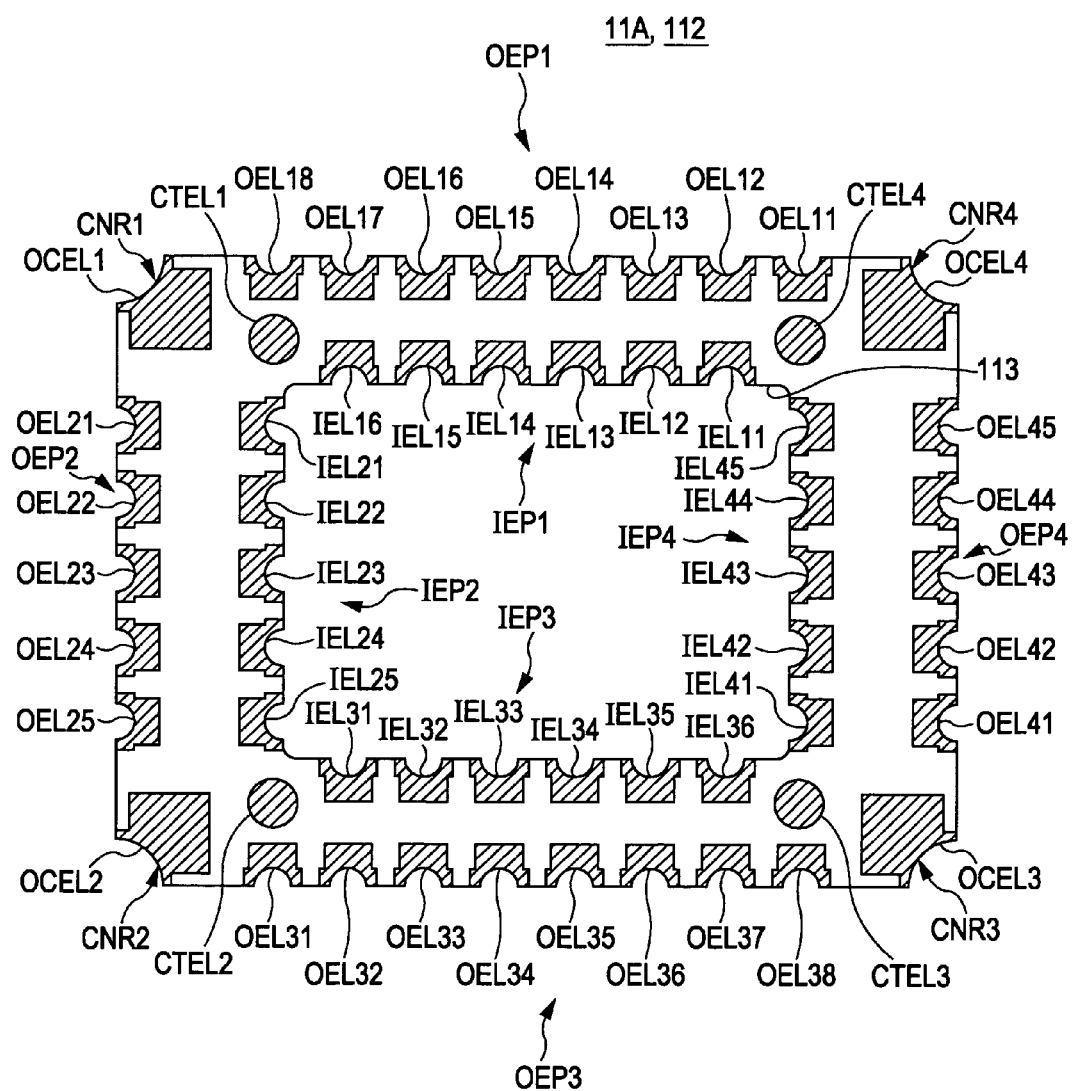
FIG. 3 illustrates a first structure example of the multilayer wiring substrate according to the embodiment of the present invention.

FIG. 3 illustrates a first structure example of the multilayer wiring substrate according to this embodiment.

FIG. 3 illustrates a structure example on the second surface (back surface) 112 side of a multilayer wiring substrate 11A.

The multilayer wiring substrate 11A in FIG. 3 is formed as a rectangular parallelepiped (rectangle) as a whole.

As mentioned earlier, the through hole 113 that passes from the first surface (front surface) 111 through to the second surface (back surface) 112 is formed in the center portion of the multilayer wiring substrate 11A.

In the multilayer wiring substrate 11A in FIG. 3, first electrical connection terminals (referred to below as inner peripheral electrodes) IEL are formed in all of inner edge portions IEP1, IEP2, IEP3, and IEP4 which are the periphery of the through hole 113, on the second surface (back surface) 112.

Moreover, in the multilayer wiring substrate 11A in FIG. 3, second electrical connection terminals (referred to below as outer peripheral electrodes) OEL are formed in all of outer edge portions OEP1, OEP2, OEP3, and OEP4 which are the outer periphery of the substrate itself.

Furthermore, in the multilayer wiring substrate 11A in FIG. 3, electrical connection terminals (referred to below as corner electrodes) OCEL1, OCEL2, OCEL3, and OCEL4 that are included in outer peripheral electrodes are formed respectively in four corners CNR1, CNR2, CNR3, and CNR4 of the outer periphery of the substrate.

In addition, in the multilayer wiring substrate 11A in FIG. 3, third electrical connection terminals (referred to below as internal electrodes) CTEL1, CTEL2, CTEL3, and CTEL4 are formed in non-edge portions (inside) between the inner edge portion IEP1 and the outer edge portion OEP1 and between the inner edge portion IEP3 and the outer edge portion OEP3.

The numbers of inner peripheral electrodes IEL, outer peripheral electrodes OEL, and internal electrodes CTEL illustrated in this embodiment are merely an example. Though the numbers of electrodes are illustrated to be several for the sake of clarity, in actuality the numbers of electrodes are not limited to the illustrated numbers and are appropriately set according to intended use.

In FIG. 3, inner peripheral electrodes IEL11, IEL12, IEL13, IEL14, IEL15, and IEL16 are formed in the inner edge portion IEP1.

The inner peripheral electrodes IEL11, IEL12, IEL13, IEL14, IEL15, and IEL16 are each formed to have a castellation structure in which its side portion facing the through hole 113 is partially depressed in a circular arc.

Inner peripheral electrodes IEL21, IEL22, IEL23, IEL24, and IEL25 are formed in the inner edge portion IEP2.

The inner peripheral electrodes IEL21, IEL22, IEL23, IEL24, and IEL25 are each formed to have a castellation structure in which its side portion facing the through hole 113 is partially depressed in a circular arc.

Inner peripheral electrodes IEL31, IEL32, IEL33, IEL34, IEL35, and IEL36 are formed in the inner edge portion IEP3.

The inner peripheral electrodes IEL31, IEL32, IEL33, IEL34, IEL35, and IEL36 are each formed to have a castellation structure in which its side portion facing the through hole 113 is partially depressed in a circular arc.

Inner peripheral electrodes IEL41, IEL42, IEL43, IEL44, and IEL45 are formed in the inner edge portion IEP4.

The inner peripheral electrodes IEL41, IEL42, IEL43, IEL44, and IEL45 are each formed to have a castellation structure in which its side portion facing the through hole 113 is partially depressed in a circular arc.

In FIG. 3, outer peripheral electrodes OEL11, OEL12, OEL13, OEL14, OEL15, OEL16, OEL17, and OEL18 are formed in the outer edge portion OEP1.

The outer peripheral electrodes OEL11, OEL12, OEL13, OEL14, OEL15, OEL16, OEL17, and OEL18 are each formed to have a castellation structure in which its side portion facing the outside is partially depressed in a circular arc.

Outer peripheral electrodes OEL21, OEL22, OEL23, OEL24, and OEL25 are formed in the outer edge portion OEP2.

The outer peripheral electrodes OEL21, OEL22, OEL23, OEL24, and OEL25 are each formed to have a castellation structure in which its side portion facing the outside is partially depressed in a circular arc.

Outer peripheral electrodes OEL31, OEL32, OEL33, OEL34, OEL35, OEL36, OEL37, and OEL38 are formed in the outer edge portion OEP3.

The outer peripheral electrodes OEL31, OEL32, OEL33, OEL34, OEL35, OEL36, OEL37, and OEL38 are each formed to have a castellation structure in which its side portion facing the outside is partially depressed in a circular arc.

Outer peripheral electrodes OEL41, OEL42, OEL43, OEL44, and OEL45 are formed in the outer edge portion OEP4.

The outer peripheral electrodes OEL41, OEL42, OEL43, OEL44, and OEL45 are each formed to have a castellation structure in which its side portion facing the outside is partially depressed in a circular arc.

Moreover, the corner electrodes OCEL1, OCEL2, OCEL3, and OCEL4 are each formed to have a castellation structure in which its side portion facing the outside is partially depressed in a circular arc.

Thus, in the multilayer wiring substrate 11A in FIG. 3, the inner peripheral electrodes IEL are formed in all of the inner edge portions IEP1, IEP2, IEP3, and IEP4 which are the periphery of the through hole 113, on the second surface (back surface) 112.

Moreover, in the multilayer wiring substrate 11A in FIG. 3, the outer peripheral electrodes OEL are formed in all of the outer edge portions OEP1, OEP2, OEP3, and OEP4 which are the outer periphery of the substrate itself.

Furthermore, in the multilayer wiring substrate 11A in FIG. 3, the corner electrodes OCEL1, OCEL2, OCEL3, and OCEL4 are formed respectively in the four corners CNR1, CNR2, CNR3, and CNR4 of the outer periphery of the substrate.

Since each of these electrodes has a castellation structure, the number of electrodes can be increased and the solder connection strength against thermal shock and the like can be enhanced as compared with, for example, the case where no electrode is provided in any edge portion, as described later.

In addition, the multilayer wiring substrate 11A in FIG. 3 has an effective shape that allows a joint area to be visually inspected when the multilayer wiring substrate 11A is joined to another multilayer wiring substrate, and has an electrode arrangement that takes inspectability into consideration.

SECOND STRUCTURE EXAMPLE OF THE
MULTILAYER WIRING SUBSTRATE

Figure 4:
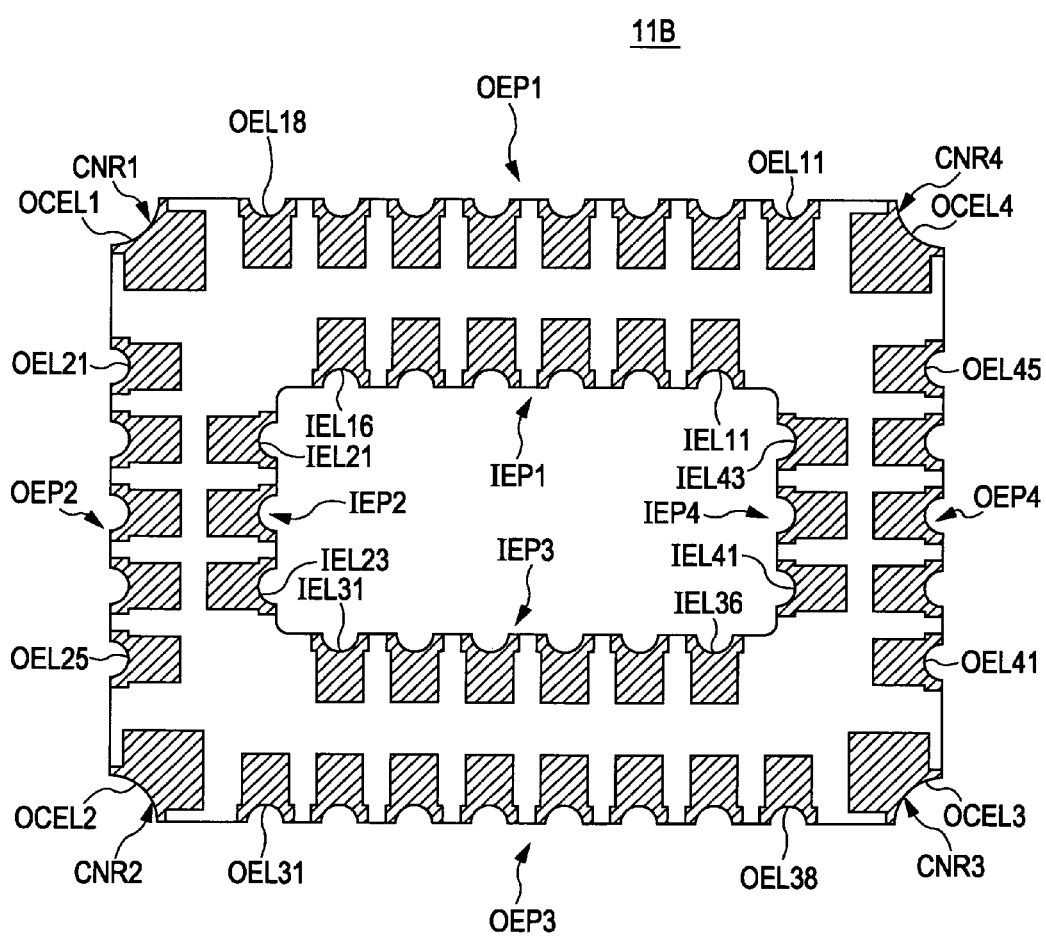
FIG. 4 illustrates a second structure example of the multilayer wiring substrate according to the embodiment of the present invention.

FIG. 4 illustrates a second structure example of the multilayer wiring substrate according to this embodiment.

FIG. 4 illustrates a structure example on the second surface (back surface) 112 side of a multilayer wiring substrate 11B.

The multilayer wiring substrate 11B in FIG. 4 is basically different from the multilayer wiring substrate 11A in FIG. 3 in that the internal electrodes CTEL1, CTEL2, CTEL3, and CTEL4 are not formed.

In the multilayer wiring substrate 11B in FIG. 4, three inner peripheral electrodes IEL21, IEL22, and IEL23 are formed in the inner edge portion IEP2, and three inner peripheral electrodes IEL41, IEL42, and IEL43 are formed in the inner edge portion IEP4.

The multilayer wiring substrate 11B in FIG. 4 also has a shape that allows a joint area to be visually inspected when the multilayer wiring substrate 11B is joined to another multilayer wiring substrate, and has an electrode arrangement that takes inspectability into consideration.

In addition, in the multilayer wiring substrate 11B, the number of electrodes can be increased and the solder connection strength against thermal shock and the like can be enhanced as compared with, for example, the case where no electrode is provided in any edge portion.

THIRD STRUCTURE EXAMPLE OF THE
MULTILAYER WIRING SUBSTRATE

Figure 5:
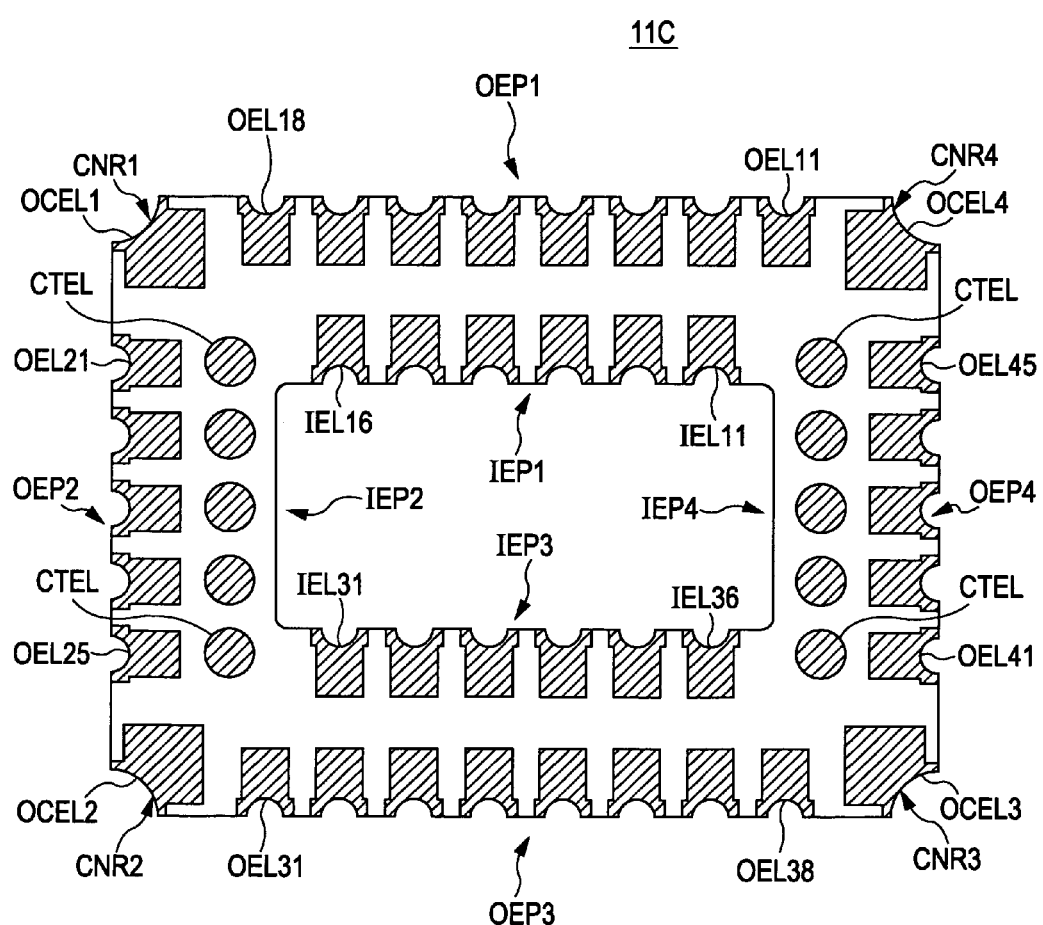
FIG. 5 illustrates a third structure example of the multilayer wiring substrate according to the embodiment of the present invention.

FIG. 5 illustrates a third structure example of the multilayer wiring substrate according to this embodiment.

FIG. 5 illustrates a structure example of the second surface (back surface) 112 side of a multilayer wiring substrate 11C.

The multilayer wiring substrate 11C in FIG. 5 is basically different from the multilayer wiring substrate 11A in FIG. 3 in the following point.

In the multilayer wiring substrate 11C, no inner peripheral electrode is formed in the inner edge portions IEP2 and IEP4, and a plurality of (five in FIG. 5) internal electrodes CTEL are formed in each non-edge portion between the inner edge portion IEP2 and the outer edge portion OEP2 and between the inner edge portion IEP4 and the outer edge portion OEP4.

In the multilayer wiring substrate 11C, the number of electrodes can be increased and the solder connection strength against thermal shock and the like can be enhanced as compared with, for example, the case where no electrode is provided in any edge portion.

FOURTH STRUCTURE EXAMPLE OF THE
MULTILAYER WIRING SUBSTRATE

Figure 6:
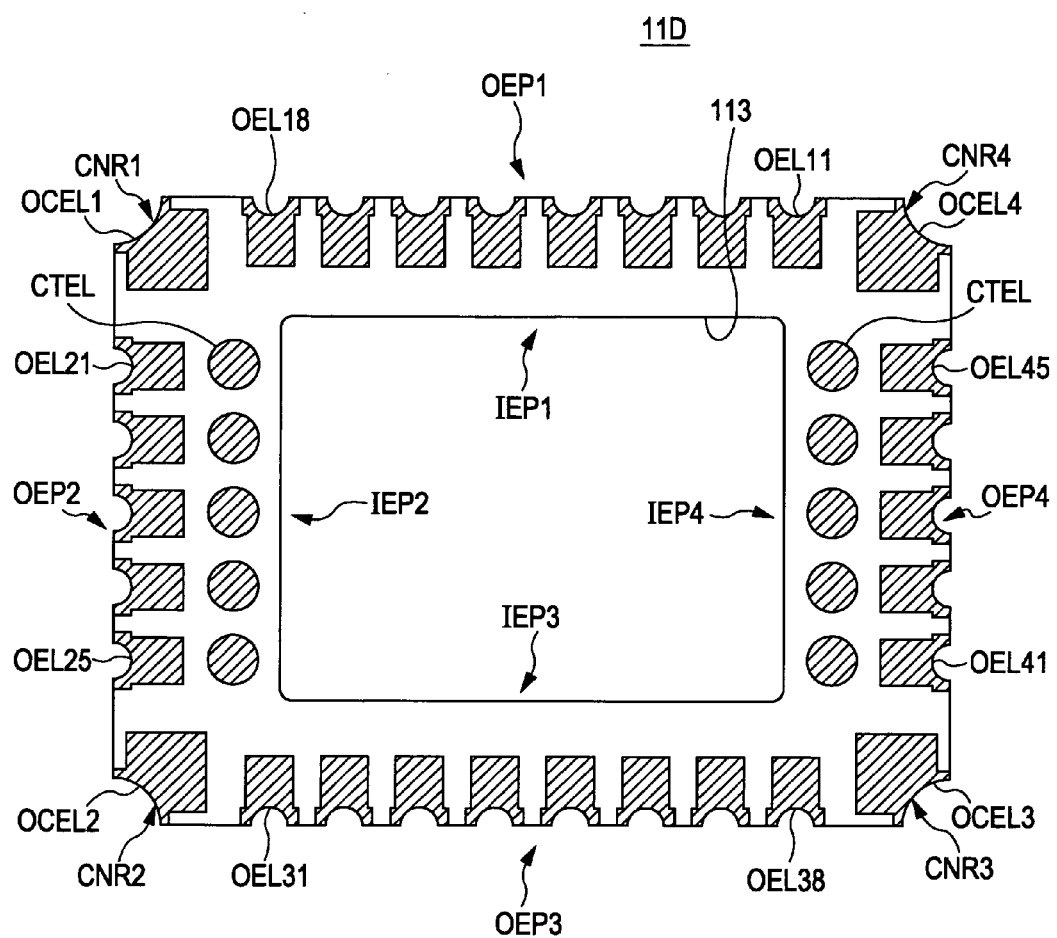
FIG. 6 illustrates a fourth structure example of the multilayer wiring substrate according to the embodiment of the present invention.

FIG. 6 illustrates a fourth structure example of the multilayer wiring substrate according to this embodiment.

FIG. 6 illustrates a structure example on the second surface (back surface) 112 side of a multilayer wiring substrate 11D.

The multilayer wiring substrate 11D in FIG. 6 is basically different from the multilayer wiring substrate 11C in FIG. 5 in the following point.

In the multilayer wiring substrate 11D, no inner peripheral electrode is formed in any of the inner edge portions IEP1, IEP2, IEP3, and IEP4.

The multilayer wiring substrate 11D has an effective shape for maximizing the through hole 113 to thereby maximize a mounting area inside the through hole 113 when the multilayer wiring substrate 11D is joined to another multilayer wiring substrate.

Moreover, in the multilayer wiring substrate 11D, the number of electrodes can be increased and the solder connection strength against thermal shock and the like can be enhanced as compared with, for example, the case where no electrode is provided in any edge portion.

FIFTH STRUCTURE EXAMPLE OF THE MULTILAYER WIRING SUBSTRATE

Figure 7:
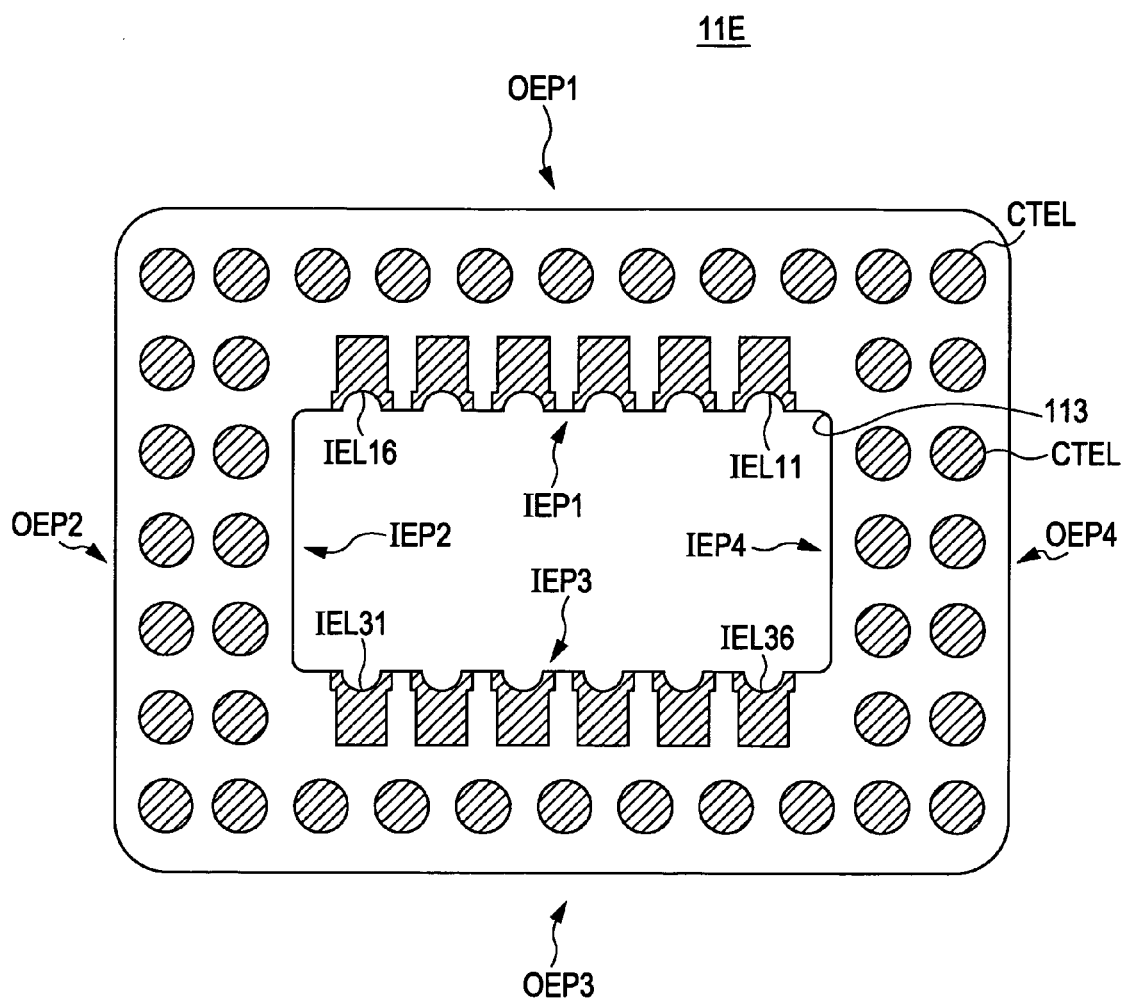
FIG. 7 illustrates a fifth structure example of the multilayer wiring substrate according to the embodiment of the present invention.

FIG. 7 illustrates a fifth structure example of the multilayer wiring substrate according to this embodiment.

FIG. 7 illustrates a structure example on the second surface (back surface) 112 side of a multilayer wiring substrate 11E.

The multilayer wiring substrate 11E in FIG. 7 is basically different from the multilayer wiring substrate 11C in FIG. 5 in the following point.

In the multilayer wiring substrate 11E, no inner peripheral electrode is formed in the inner edge portions IEP2 and IEP4, no outer peripheral electrode is formed in any of the outer edge portions OEP1 to OEP4, and a plurality of (42 in FIG. 7) internal electrodes CTEL are formed throughout the whole non-edge portion as internal electrodes for connection.

The multilayer wiring substrate 11E has an effective shape for increasing the number of connection terminals and also providing a same mounting area as the outer shape of the multilayer wiring substrate according to this embodiment, when the multilayer wiring substrate 11E is joined to another multilayer wiring substrate.

Moreover, in the multilayer wiring substrate 11E, the number of electrodes can be increased and the solder connection strength against thermal shock and the like can be enhanced as compared with, for example, the case where no electrode is provided in any edge portion.

SIXTH STRUCTURE EXAMPLE OF THE MULTILAYER WIRING SUBSTRATE

Figure 8:
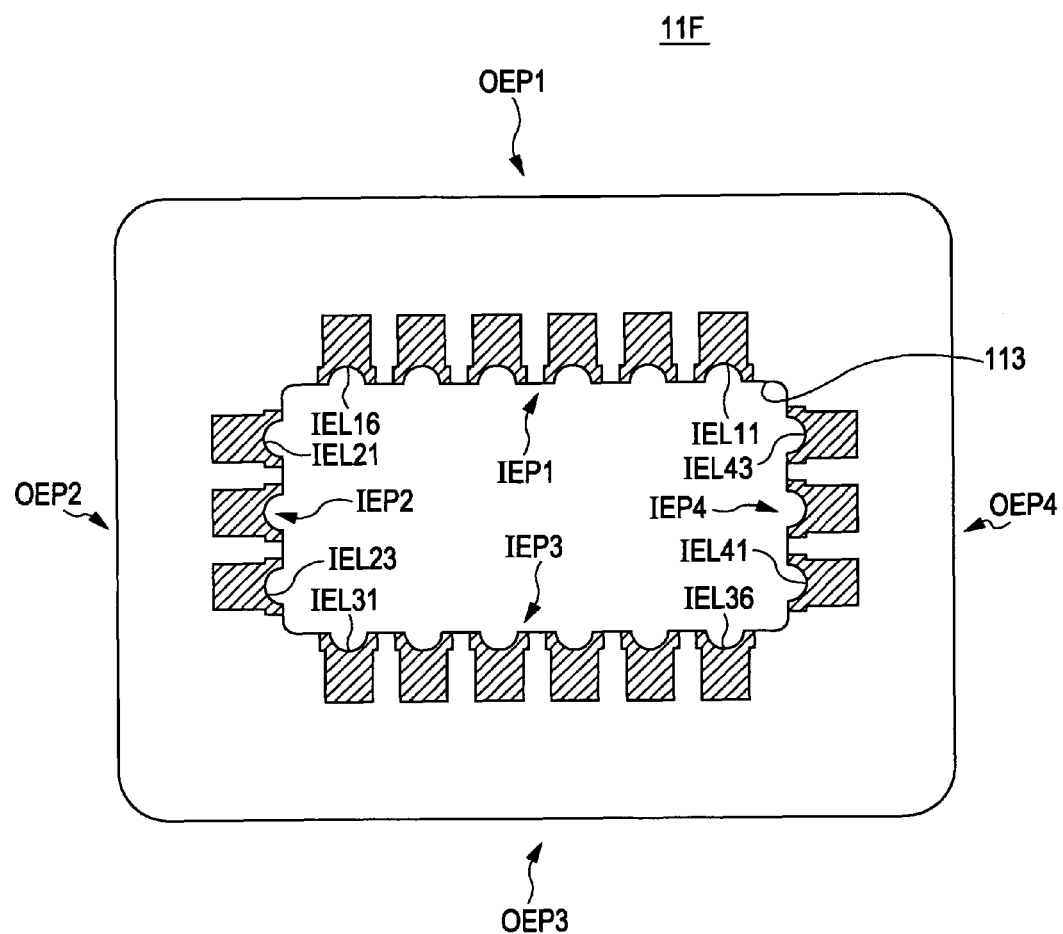
FIG. 8 illustrates a sixth structure example of the multilayer wiring substrate according to the embodiment of the present invention.

FIG. 8 illustrates a sixth structure example of the multilayer wiring substrate according to this embodiment.

FIG. 8 illustrates a structure example on the second surface (back surface) 112 side of a multilayer wiring substrate 11F.

The multilayer wiring substrate 11F in FIG. 8 is basically different from the multilayer wiring substrate 11C in FIG. 5 in the following point.

In the multilayer wiring substrate 11F, no outer peripheral electrode is formed in any of the outer edge portions OEP1 to OEP4, and no internal electrode for connection is formed throughout the whole non-edge portion.

In the multilayer wiring substrate 11F, the number of electrodes can be increased and the solder connection strength against thermal shock and the like can be enhanced as compared with, for example, the case where no electrode is provided in any edge portion.

SEVENTH STRUCTURE EXAMPLE OF THE MULTILAYER WIRING SUBSTRATE

Figure 9:
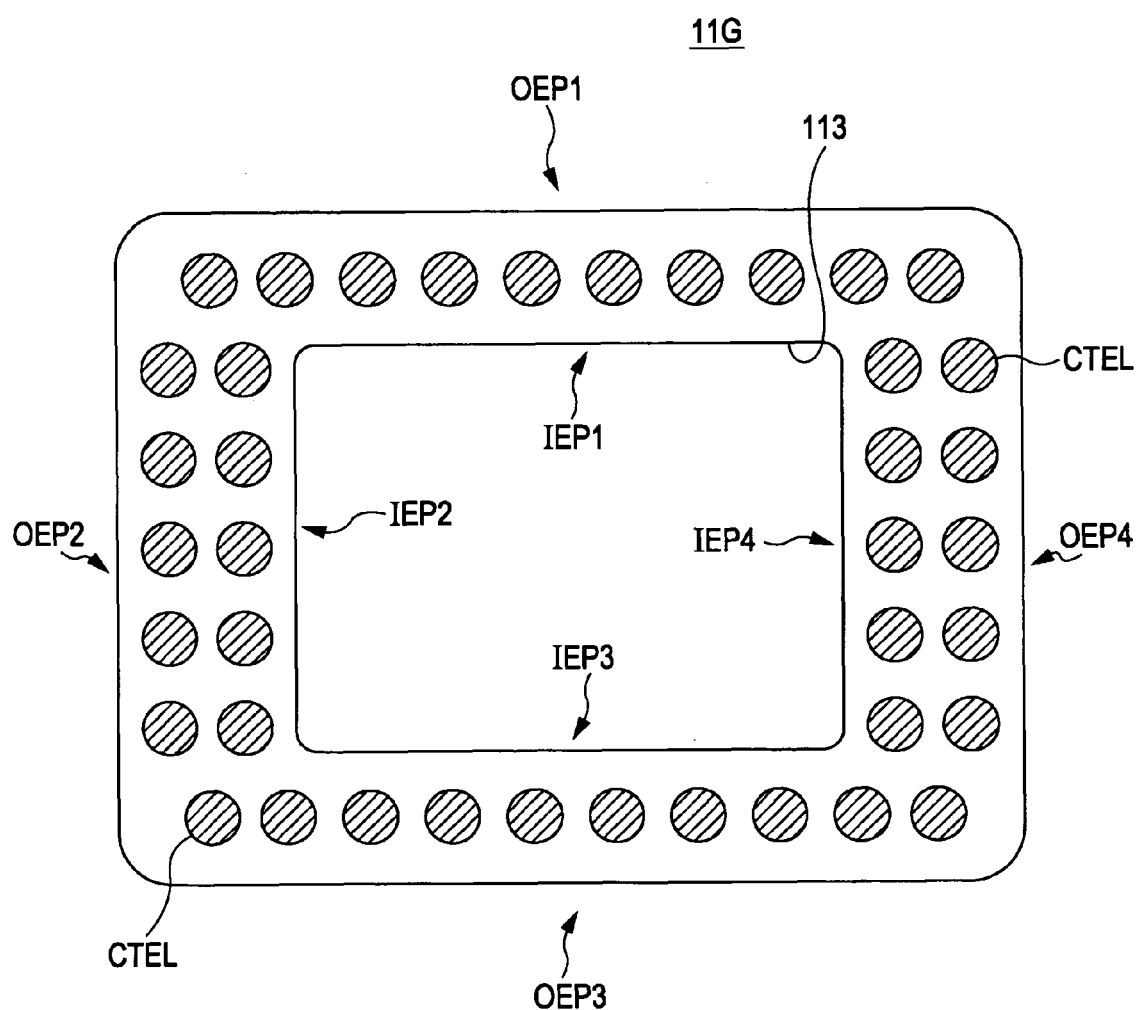
FIG. 9 illustrates a seventh structure example of the multilayer wiring substrate according to the embodiment of the present invention.

FIG. 9 illustrates a seventh structure example of the multilayer wiring substrate according to this embodiment.

FIG. 9 illustrates a structure example on the second surface (back surface) 112 side of a multilayer wiring substrate 11G.

The multilayer wiring substrate 11G in FIG. 9 is basically different from the multilayer wiring substrate 11D in FIG. 6 in the following point.

In the multilayer wiring substrate 11G, no outer peripheral electrode is formed in any of the outer edge portions OEP1 to OEP4, and a plurality of internal electrodes for connection are formed throughout the whole non-edge portion.

The multilayer wiring substrate 11G has an effective shape for minimizing a mounting area when the multilayer wiring substrate 11G is joined to another multilayer wiring substrate.

In the multilayer wiring substrate 11G, the number of internal electrodes can be increased though the connection strength is lower than the first to sixth structure examples.

The number of electrodes and the solder strength against thermal shock in each of the multilayer wiring substrate 11D in FIG. 6 and the multilayer wiring substrate 11A in FIG. 3 are examined below, relative to the multilayer wiring substrate 11G in FIG. 9.

FIG. 10 shows the number of electrodes and a result of measured solder strength against thermal shock in each of the multilayer wiring substrates in FIGS. 6 and 3, relative to the multilayer wiring substrate in FIG. 9.

In FIG. 10, the connection strength is indicated as a ratio of an actually measured value of a test piece to that of the multilayer wiring substrate 11G in FIG. 9, which is set to 1 as the reference (reference pattern).

In this case, the connection strength of the multilayer wiring substrate 11D in FIG. 6 is 1.71 times that of the multilayer wiring substrate 11G in FIG. 9 as the reference pattern.

The connection strength of the multilayer wiring substrate 11A in FIG. 3 is 1.64 times that of the multilayer wiring substrate 11G in FIG. 9 as the reference pattern.

Meanwhile, when the number of electrodes in the multilayer wiring substrate 11G in FIG. 9 is 40, the number of electrodes in the multilayer wiring substrate 11D in FIG. 6 is 56 which is 1.4 times that of the multilayer wiring substrate 11G in FIG. 9 as the reference pattern.

The number of electrodes in the multilayer wiring substrate 11A in FIG. 3 is 56 which is 1.4 times that of the multilayer wiring substrate 11G in FIG. 9 as the reference pattern.

As described above, in the multilayer wiring substrates 11 and 11A to 11F according to this embodiment, the through hole 113 that passes from the first surface (front surface) 111 through to the second surface (back surface) 112 is formed in the center portion.

In the multilayer wiring substrate 11, an electrical connection terminal (electrode) is formed in at least one of the inner edge portion IEP which is the periphery of the through hole 113, the outer edge portion OEP which is the outer periphery of the substrate itself, and the non-edge portion, on at least one of the first surface 111 and the second surface 112.

In the multilayer wiring substrate 11, the electrical connection terminal (electrode) formed in at least one of the inner, edge portion IEP and the outer edge portion OEP has a castellation (depression) structure that does not pass through to (does not reach) a surface opposite to a formation surface.

Accordingly, the multilayer wiring substrates 11 and 11A to 11F can improve the strength of connection to another substrate and the like and also increase the number of electrodes (the number of terminals).

Moreover, the multilayer wiring substrate 11G can minimize the mounting area when being joined to another multilayer wiring substrate.

The stack structure sensor package 10 in FIG. 2 using any of the multilayer wiring substrates 11 and 11A to 11G having the above-mentioned features allows a sensor component to be reused even when a failure occurs during manufacture, improves connection strength of the sensor component, and makes the structure small and thin.

FIGS. 11A to 11D illustrate a method of manufacturing the stack structure sensor package 10 in FIG. 2.

The method of manufacturing the stack structure sensor package 10 in FIG. 2 is described below, with reference to FIGS. 11A to 11D.

Figure 11A:
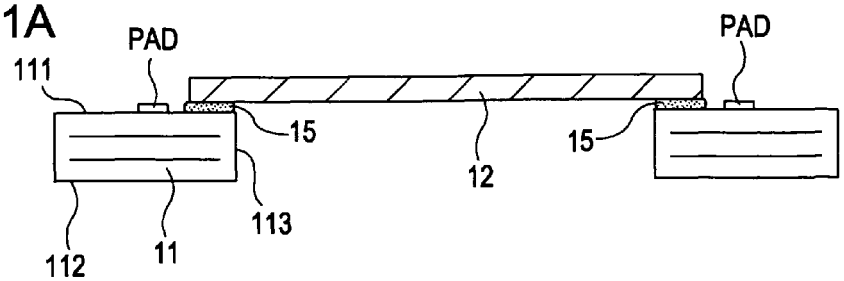
FIGS. 11A to 11D illustrate a method of manufacturing the stack structure sensor package in FIG. 2.

First, as illustrated in FIG. 11A, the image sensor 12 is fixed, by an adhesive 15, to the surface of the multilayer wiring substrate 11 that has the through hole 113 and includes the wire bonding pad PAD on the first surface (front surface) 111 and at least any of the electrodes IEL, OEL, and CTEL for connection to another substrate on the second surface (back surface) 112.

Figure 11B:
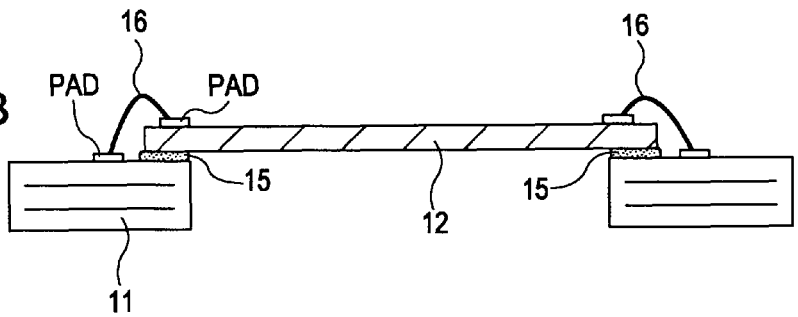

Next, as illustrated in FIG. 11B, the image sensor 12 and the pad PAD of the multilayer wiring substrate 11 are electrically connected by a wire 16.

Figure 11C:
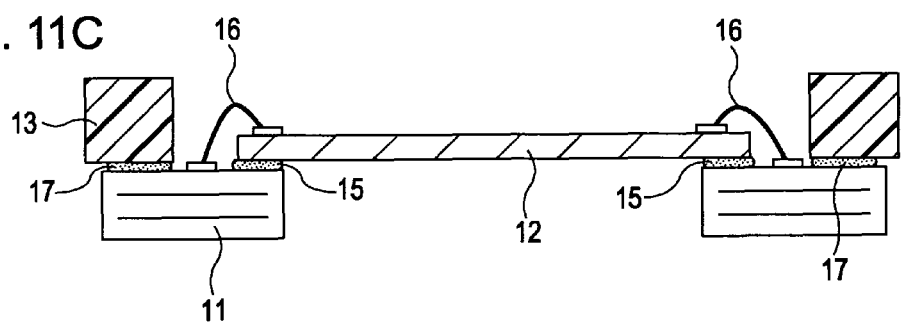

Following this, as illustrated in FIG. 11C, the frame 13 is fixed to the first surface (front surface) 111 of the multilayer wiring substrate 11 by an adhesive 17 so as to surround the image sensor 12.

Figure 11D:
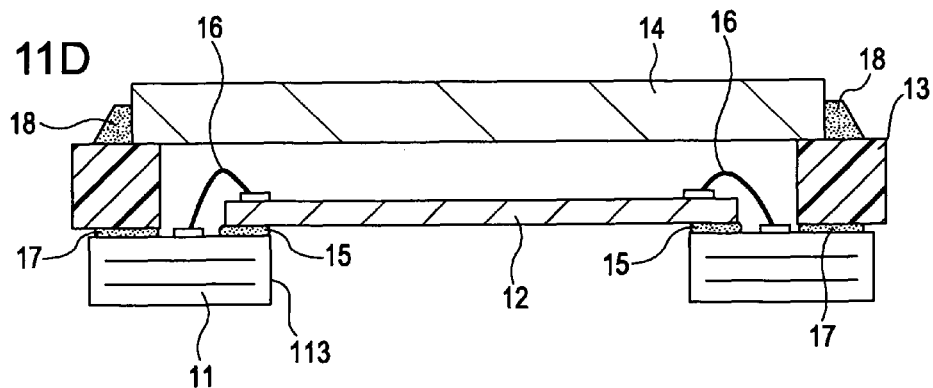

Subsequently, as illustrated in FIG. 11D, the optical filter 14 is bonded to a surface of the frame 13 formed of ceramic, a resin, or the like by an adhesive 18 and sealed together.

This completes the manufacture of the stack structure sensor package 10 in FIG. 2 as an image sensor component.

The stack structure sensor package 10 in FIG. 2 manufactured in this way allows a sensor component to be reused even when a failure occurs during manufacture, improves connection strength of the sensor component, and makes the structure small and thin.

<2. Another Embodiment>

Figure 12:
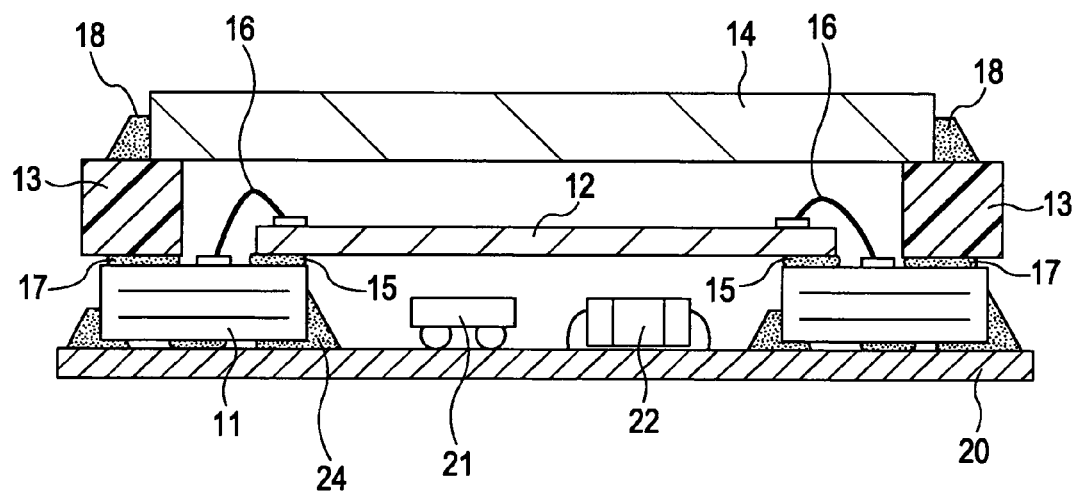
FIG. 12 illustrates a structure example of a stack structure sensor package to which a multilayer wiring substrate is applied according to another embodiment of the present invention.

FIG. 12 illustrates a structure example of a stack structure sensor package to which a multilayer wiring substrate is applied according to another embodiment of the present invention.

A stack structure sensor package 10A according to the other embodiment is different from the sensor package 10 according to the embodiment described earlier in the following point.

In the stack structure sensor package 10A, an organic multilayer substrate 20 on which electronic devices such as an integrated circuit 21 and an electronic component 22 like a resistor are mounted is connected to the second surface (back surface) 112 of the multilayer wiring substrate 11 at the above-mentioned connection terminals (electrodes), by solder 24.

The stack structure sensor package 10A is formed through the following manufacturing process after manufacturing the sensor package 10 in FIG. 2 as described earlier.

The integrated circuit 21 and the electronic component 22 are mounted on the organic multilayer substrate 20 other than the multilayer wiring substrate 11, the sensor package 10 is mounted so as to cover the integrated circuit 21 and the electronic component 22, and the sensor package 10 and the organic multilayer substrate 20 are simultaneously soldered to obtain the sensor package 10A having the stack structure.

The stack structure sensor packages 10 and 10A according to the embodiments have been described above.

In the above description, FIGS. 3 to 9 merely illustrate electrode arrangement examples, and the number of electrodes, a pitch between electrodes, and an electrode size are changed according to intended use.

Moreover, the shapes of the multilayer wiring substrate 11 and the through hole 113 are changed according to intended use.

The multilayer wiring substrate 11 may be any of an organic substrate and an inorganic substrate.

Electrode plating in the multilayer wiring substrate 11 may be copper patterning, gold plating, or rustproofing.

Furthermore, the component mounted under the semiconductor device according to the embodiments may be any of an active component and a passive component.

As described above, according to the embodiments, the multilayer wiring substrate 11 having the through hole 113 is used in the sensor component.

As a result, when packaging the sensor component with the electronic component and the integrated circuit necessary for a sensor package operation in a separate process, the electronic component and the integrated circuit can be placed under the sensor component.

Moreover, the following effects can be attained by the method of manufacturing the stack structure sensor package by which the sensor component can be simultaneously soldered together with these components.

By using the multilayer wiring substrate 11 having the through hole 113, connection terminals can be provided not only on the bottom surface of the substrate but also in the outer periphery of the substrate and the periphery of the through hole. In addition, since each terminal has a castellation structure, a fillet can be formed at the time of soldering, which improves the joint strength between the organic multilayer substrate and the sensor package (sensor component).

By treating the sensor package that includes the multilayer wiring substrate 11 having the through hole 113 as a component, the stack structure sensor package can be manufactured in ordinary mounting equipment, which provides general versatility to the manufacturing process at any manufacturing location.

By treating the sensor package that includes the multilayer wiring substrate 11 having the through hole 113 as a component, soldering can be performed together with the electronic component and the integrated circuit placed under the sensor. This enables the stack structure sensor package to be manufactured by a simple process.

Since it is possible to solder the component placed under the sensor package that includes the multilayer wiring substrate 11 having the through hole 113, not only an integrated circuit but also a wide variety of components can be used. This contributes to greater flexibility and improved performance of the stack structure sensor package.

The sensor package that includes the multilayer wiring substrate 11 having the through hole 113 is manufactured in a separate process from the electronic component and the integrated circuit placed under the sensor package. Therefore, when a failure occurs during the manufacture of the sensor component, only the sensor component is subject to the disposal cost. Hence, the disposal cost upon an occurrence of a failure can be reduced.

Furthermore, when a failure occurs during the manufacture of the sensor package, the disposal cost can be reduced by reusing the sensor component.

The present application contains subject matter related to that disclosed in Japanese Priority Patent Application JP 2009-083658 filed in the Japan Patent Office on Mar. 30, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A multilayer wiring substrate having a first surface and a second surface, comprising:
   a through hole that passes from the first surface through to the second surface; and
   an electrical connection terminal formed in at least one of an inner edge portion which is a periphery of the through hole, an outer edge portion which is an outer periphery of the substrate, and a non-edge portion, on at least one of the first surface and the second surface;

wherein the electrical connection terminal has a castellation structure that does not pass through to a surface opposite to a formation surface.

2. The multilayer wiring substrate according to claim 1, wherein the electrical connection terminal is formed in at least the outer edge portion from among the inner edge portion and the outer edge portion.

3. The multilayer wiring substrate according to claim 1, wherein an electrical internal connection terminal is formed in the non-edge portion between the inner edge portion and the outer edge portion.

4. The multilayer wiring substrate according to claim 2, wherein an electrical internal connection terminal is formed in the non-edge portion between the inner edge portion and the outer edge portion.

* * * * *

UNITED STATES PATENT AND TRADEMARK OFFICE
CERTIFICATE OF CORRECTION

| | | |
|---|---|---|
| PATENT NO. | : 8,446,002 B2 | Page 1 of 1 |
| APPLICATION NO. | : 12/659258 | |
| DATED | : May 21, 2013 | |
| INVENTOR(S) | : Noriko Shibuta et al. | |

It is certified that error appears in the above-identified patent and that said Letters Patent is hereby corrected as shown below:

Title Page:

FOREIGN PATENT DOCUMENTS section

"JP 60-098648 A 9/1985" should read -- JP 60-098648 A 6/1985 --.
"JP 200630335 A 11/2006" should read -- JP 2006-303335 A 11/2006 --.

Signed and Sealed this
Twentieth Day of August, 2013

Teresa Stanek Rea
*Acting Director of the United States Patent and Trademark Office*